United States Patent [19]

Sakurai

[11] Patent Number: 4,517,278

[45] Date of Patent: May 14, 1985

[54] FLEXOGRAPHIC PRINTING PLATES AND PROCESS FOR MAKING THE SAME

[75] Inventor: Kiyomi Sakurai, Neyagawa, Japan

[73] Assignee: Nippon Paint Co., Ltd., Osaka, Japan

[21] Appl. No.: 407,825

[22] Filed: Aug. 13, 1982

Related U.S. Application Data

[63] Continuation of Ser. No. 224,499, Jan. 13, 1981, abandoned, which is a continuation-in-part of Ser. No. 647,717, Jan. 9, 1976, abandoned, and a continuation of Ser. No. 92,291, Nov. 8, 1979, abandoned.

[51] Int. Cl.³ .............................................. G03C 1/72
[52] U.S. Cl. .................................... 430/286; 430/306; 430/918
[58] Field of Search .............................. 264/134–137; 430/286, 306

[56] References Cited

U.S. PATENT DOCUMENTS 3,615,469 10/1971 Ramp .............................. 430/286 X Primary Examiner—John D. Welsh
Attorney, Agent, or Firm—Niro, Scavone

[57] ABSTRACT

A photosensitive resin composition useful for preparation of flexographic printing plates, which comprises syndiotactic 1,2-polybutadiene, an ethylenically unsaturated monomer and a photo-polymerization initiator, the syndiotactic 1,2-polybutadiene having an average molecular weight of from about 10,000 to 300,000, a 1,2-unit content of at least about 80 percent and a crystallinity of about 10 to 30 percent, said ethylenically unsaturated monomer being an ester of acrylic or methacrylic acid with an alkanol having from 4 to 20 carbon atoms, and the photo-polymerization initiator being benzoin or an alkyl ether thereof. The photosensitive resin composition, when formed into sheets, exhibits satisfactory resistance to liquids used for washing out the uncured areas and at also to aqueous or alcoholic printing inks, thereby producing patterns in relief that give excellent overall sharpness. It also possesses desired hardness and elasticity for flexographic printing plates.

3 Claims, No Drawings

FLEXOGRAPHIC PRINTING PLATES AND PROCESS FOR MAKING THE SAME

This application is a continuation of application Ser. No. 224,499, filed Jan. 13, 1981, which is a continuation-in-part of Ser. No. 647,717, filed Jan. 9, 1976 and a continuation of Ser. No. 92,291, filed Nov. 8, 1979, all abandoned.

The present invention relates to a photosensitive resin composition useful for preparation of flexographic printing plates. More particularly, it relates to a photosensitive resin composition for preparation of flexographic printing plates having improved properties particularly with respect to resistance to liquids such as aqueous or alcoholic inks employed generally in the field of printing.

Flexography is a field of letterpress printing that requires its plate material to have elastic properties similar to those of rubber materials. Flexography usually employs aqueous or alcoholic inks in printing, so that it requires plate materials possessing properties such that the materials do not transform or swell upon continuous contact with such inks. Heretofore, flexographic printing plates have been prepared generally in either of two ways. One process is that a metallic master plate is first prepared from a negative; a matrix composed of a phenol-formaldehyde condensate, e.g., Bakelite (trademark), is made from the master plate; raw rubber is poured onto the matrix and then vulcanized. This process is so complicated that improvements have long been desired. Another process is of the type requiring skilled work in such a manner that patterns in relief are made directly by carving or engraving rubber plates.

In order to improve such procedures, a process in which a photosensitive resin composition is employed has also been proposed. In this process, the composition is cured by radiation of light through a negative carrying transparent image areas and the uncured areas are then washed out with liquids such as water, alkaline solutions or alcohols. Thus, this process requires the use of photosensitive resin compositions which are soluble in such liquids, while the flexographic printing plates made from the compositions have insufficient resistance to such liquids. When used for printing large amounts of paper, the plates may be subject to swelling, thereby impairing the quality of the printed patterns. Further, the plates made from conventional photosensitive resin compositions are not satisfactory in their elasticity, hardness and elongation so that they cannot be a substitute for rubber materials.

It is known that syndiotactic 1,2-polybutadiene can be employed as a photocurable material in combination with a photo-sensitizer, because it may be easily cross linked by ultraviolet irradiation due to double bonds in its side chains, as described in ACS Symposium Series, Number 4, pages 26-35 (1974). Further, Japanese Patent Publication (unexamined) Nos. 11047/1973 and 125106/1974 disclose that the combination of syndiotactic 1,2-polybutadiene and a photo-sensitizer can be used as a plastic matrix that is prepared by pressing it upon a master plate and then cured by the action of ultraviolet radiation. It is to be noted, however, that the mere combination of syndiotactic 1,2-polybutadiene with a photo-sensitizer does not possess a sufficient sensitivity to light irradiation and cannot provide the cured image areas with a satisfactory hardening. The lack of satisfactory hardness will allow the cured image areas of the printing plate to become swollen upon washing with xylene and some portions, particularly fine shapes, of the cured areas will be damaged and washed out. This is extremely disadvantageous and renders such a material useless as the printing plate.

It is therefore a primary object of the present invention to provide a photosensitive resin composition useful for peparation of flexographic printing plates that can overcome the disadvantages of conventional compositions. Another object of this invention is to provide a photosensitive resin composition that can be prepared on a large scale with ease and at low costs. Other objects, features and advantages of the invention will become apparent in the following description of the specification and from the appended claims.

According to the present invention, there is provided a preparation of photosensitive resin composition useful for flexographic printing plates, which comprises syndiotactic 1,2-polybutadiene, an ethylenically unsaturated monomer and a photo-polymerization initiator. The use of syndiotactic 1,2-polybutadiene brings various advantages such as favorable rubbery properties, high resistance to liquids (e.g., water, alcohols) and reduced costs. It is to be noted that the combined use of said monomer and initiator with syndiotactic 1,2-polybutadiene can enhance remarkably the sensitivity to light and prevent the swelling of image areas during the washing out of the uncured areas with xylene, thereby producing patterns in relief that give excellent overall sharpness.

There are known various photosensitive resin compositions comprising polymeric binders and ethylenically unsaturated monomers. However, the combined use of syndiotactic 1,2-polybutadiene with any ethylenically unsaturated monomer was never attempted. Further, it was experimentally recognized by the present inventor that syndiotactic 1,2-polybutadiene is insoluble or sparingly soluble in ordinary solvents such as aliphatic hydrocarbons, ketones and alcohols, and it is very difficult to intimately and uniformly mix syndiotactic 1,2-polybutadiene with ethylenically unsaturated monomers such as acrylic acid and methacrylic acid, and their esters.

It has now been found that a certain type of an ethylenically unsaturated monomer possesses a good compatibility with syndiotactic 1,2-polybutadiene and mixes uniformly with it. This type of the ethylenically unsaturated monomer requires no employment of any solvent for mixing so that the resulting composition can be easily melt molded into sheets or plates. This is very advantageous in preparing flexographic sheets of plates on a large scale and with low cost. Usually, a flexographic printing plate has a total thickness or relief depth of about 1 to 6 mm, and therefore the evaporation of a solvent, if used, from the composition takes a long time and requires a great amount of energy. Therefore, the absence of any such solvent for mixing is advantageous also from this viewpoint. The use of a photo-polymerization initiator having a good solubility in said monomer can serve to prevent the initiator from being separated out from the molded sheet products.

The syndiotactic 1,2-polybutadiene to be used in the present invention may be any 1,2-polybutadiene having an average molecular weight of from about 10,000 to 300,000, a 1,2-unit content of about 80 to 100 percent, and a crystallinity of from about 10 to 30 percent. Particularly the one having an average molecular weight of from about 100,000 to 200,000, a 1,2-unit content of about 90 to 100 percent, and a crystallinity of from about 15 to 25 percent possesses properties suitable for flexographic printing plates with respect to their rubber-like elasticity and their resistance to liquids such as water or alcohols. Said syndiotactic 1,2-polybutadiene generally has a melting point in a range of about 65° to 110° C. This is very advantageous in molding the resulting composition into sheets or plates, because the thermal polymerization of the ethylenically unsaturated monomers does not take place in this temperature range during the melt molding.

The ethylenically unsaturated monomer to be used in the present invention may be any monomer that is compatible with syndiotactic 1,2-polybutadiene and can addition polymerize therewith. Such ethylenically unsaturated monomers include, for example, esters of acrylic acid or methacrylic acid with an alkanol having from 4 to 20 carbon atoms. Illustrative examples of the esters are butyl acrylate, isobutyl acrylate, hexyl acrylate, 2-ethylhexyl acrylate, neopentyl acrylate, octyl acrylate, lauryl acrylate, stearyl acrylate, butyl methacrylate, isobutyl methacrylate, hexyl methacrylate, 2-ethylhexyl methacrylate, neopentyl methacrylate, octyl methacrylate, lauryl methacrylate, stearyl methacrylate, 1,6-hexyl diacrylate, neopentyl diacrylate, 1,6-hexyl dimethacrylate and neopentyl dimethacrylate. The ethylenically unsaturated monomers may be employed alone or in combination with each other. They may be used in an amount in the range of from about 5 to 300 parts by weight, preferably from about 5 to 150 parts by weight with respect to 100 parts by weight of syndiotactic 1,2-polybutadiene. Additional unsaturated monomers, i.e. those other than said ethylenically unsaturated monomers, may also be used only in combination with the latter in an amount in the range within which they do not adversely affect the compatibility of the ethylenically unsaturated monomers with syndiotactic 1,2-polybutadiene, because the additional unsaturated monomers themselves lack the necessary compatibility therewith. Examples of such monomers are, for example, ethylene glycol diacrylate or dimethacrylate, trimethylolpropane triacrylate or trimethacrylate, trimethylolethane triacrylate or trimethacrylate, acrylamide, methacrylamide and N,N-methylene bisacrylamide or bismethacrylamide.

The photo-polymerization initiator to be used in the present invention may be benzoin or an alkyl ether thereof with the alkyl moiety of the ether constituent having preferably from 1 to 8 carbon atoms. The alkyl moiety may be a straight or branched aliphatic alkyl group and include, for example, methyl, ethyl, isopropyl, n-butyl and octyl. The benzoin and the alkyl ether thereof are not subject to pyrolysis at a temperature below about 100° C. and no dark reaction occurs during the molding of the composition into sheets or plates. This means that the composition containing the photo-polymerization initiator does not undergo a phenomenon in which the composition is cured by the application of heat during the molding step. The photo-polymerization initiator may be used in an amount of from about 0.025 to 30 parts by weight, preferably from about 0.1 to 15 parts by weight based on 100 parts by weight of syndiotactic 1,2-polybutadiene.

Photo-sensitizers may also be added to the photosensitive resin composition in order to further enhance its sensitivity to light for photo-polymerization. Such photosensitizers may include, for example, anthracene, p-dinitrobenzene, 2-chloro-4-nitroaniline, 9-anthranyl aldehyde, benzophenone, benzil, p,p'-tetramethyldiaminobenzophenone, 1,2-benzanthraquinone, 1,2-naphthoquinone and 4-naphthoquinone.

The flexographic printing plates prepared from the photosensitive resin composition of the present invention are usually as hard as rubber materials of the type employed for flexographic purposes and therefore can be employed as a substitute for prior art flexographic rubber plates. The flexographic printing plates are required to possess a variety of hardness or elastic properties depending upon the kind of materials to be printed or the printing inks to be used. Where the photosensitive resin composition of the invention alone cannot provide a flexographic printing plate with sufficient hardness or elasticity, it also may be possible to additionally use a plasticizer such as a polymeric plasticizer comprising at least one of ethylene, isoprene and butadiene as the monomeric constituent or a liquid plasticizer. Examples of such polymeric plasticizers are polyisobutylene, polybutene, polyisoprene rubber, ethylene-propylene rubber, other polybutadiene rubber, styrene-butadiene rubber and ethylene-vinyl acetate copolymer. Such liquid plasticizers are those having an alkyl substituent in its side chain and a boiling point of higher than about 100° C. at a normal pressure, and they may include dialkyl phthalates, dialkyl adipates, trialkyl trimellitates and alkyl vinyl ethers, the alkyl moiety being different or the same and having from four to twenty carbon atoms. Examples of the liquid plasticizers are, for example, dibutyl, dihexyl, di-2-ethylhexyl, diheptyl, dioctyl, dinonyl or diisodecyl phthalate; di-2-ethylhexyl, dioctyl or diisodecyl adipate; trioctyl or triisodecyl trimellitate; and octyl, lauryl or stearyl vinyl ether. These plasticizers possess a solubility in water or alcohols to such a negligibly slight extent that they do not adversely affect the ink-resistance of the resulting flexographic printing plates. The addition of such plasticizers does not exert an adverse influence over the quality of the resulting plates with respect to resolving power and so on. The plasticizers may be added in an amount from about 5 to 150 parts by weight, preferably from about 10 to 100 parts by weight on the basis of 100 parts by weight of syndiotactic 1,2-polybutadiene, and they may be chosen depending upon the hardness required for the flexographic printing plate. The plasticizers may be used alone or in combination with each other.

In addition, any other additive may be added for the purposes of controlling photosensitivity, improving wavelength selectivity and/or preventing the halation phenomenon, and it may include a polymerization inhibitor, a dye, an extender pigment and a filler. Examples of such inhibitors are hydroquinone, p-methoxyphenol, tert.-butyl-catechol and 2,6-di-tert.-butyl-p-cresol. Dyes such as eosine, rose bengal, methyl violet, methylene blue or malachite green may also be added in an arbitrary proportion. Furthermore, extender pigments or fillers such as glass fibers, polyethylene, polymethyl methacrylate and so on, preferably in powder form may also be added.

The photosensitive resin composition of the present invention may be prepared by compounding syndiotactic 1,2-polybutadiene, the ethylenically unsaturated monomer and the photo-polymerization initiator. With the composition, a plate bearing patterns in relief for use as the flexographic printing plate may be prepared in the following way. For example, an appropriate amount of syndiotactic 1,2-polybutadiene pellets is immersed in a solution of a given quantity of the photo-polymerization initiator in an appropriate quantity of the ethylenically unsaturated monomer by means of a mixer. A temperature at which the mixing is effected may range preferably from room temperature to about 60° C. The mixing allows the solution to permeate into the 1,2-polybutadiene pellets and form the pellets having a uniform formulation of the solution therein. Where the polymeric plasticizer is employed, it is roll-milled with syndiotactic 1,2-polybutadiene and molded into pellets. The liquid plasticizer may be used as a solution in the ethylenically unsaturated monomer. The immersed pellets are then melt molded at a temperature of about 90° C. or more, e.g., up to about 160° C. in conventional manner into sheets having a thickness of about 0.1 to 10 mm. The molding method may be press, extrusion or injection molding. The products thus molded may be used as such for the flexographic purposes. Where the molded sheet or plate is to thin, it is preferred to use a support for the sheet or plate. Such a support may include, for example, a sheet of polyester, nylon or a synthetic rubber.

The molded sheets or plates may be further processed for use as flexographic printing plates. The surface of the molded sheets or plates is so slightly tacky as is inherent in rubber materials that it may sometimes be difficult to bring a negative into intimate and uniform contact with the surface of the sheet. In order to avoid this difficulty and facilitate the intimate contact of a negative with the molded sheet or plate, it may be possible to subject the surface of the molded product to such treatment that the molten resin composition is molded into sheets or plates on a polyester sheet that was previously processed by a sanding treatment. The polyester sheet is then removed after being cooled. This treatment can give the molded product the same effect as if the sanding treatment were effected directly on the surface thereof. The sheet thus treated can provide a surface for uniform and intimate contact with a negative. This treatment can also serve to facilitate the capacity of retaining a printing ink on the plate upon printing.

In preparing a flexographic printing plate from the master plate of the photosensitive resin composition according to the present invention, the master plate is brought into intimate contact with a negative film by means of a vacuum printer and exposed to ultraviolet radiations from a suitable source conventionally used in this field, such as a high-pressure mercury lamp, a chemical lamp or a carbon arc lamp for a predetermined period of time. After the negative film is removed, the master plate is then subjected to treatment with an aromatic hydrocarbon such as xylene or toluene or a halogenated hydrocarbon such as chloroform, trichloroethane, trichloroethylene or tetrachloroethylene, whereby the uncured areas are washed out. These hydrocarbons may be used alone or in combination with alcohols, ketones or ethers. This treatment may be conducted in a conventional manner: for example, by brushing the surface of the master plate with said liquid or by spraying said liquid against the surface thereof. The master plate thus treated, after being dried, may be further subjected to exposure to ultraviolet irradiation. The resulting flexographic printing plate bears patterns in relief with their edges sharp and clear and with resistance to aqueous or alcoholic printing inks, coupled with its good rubber-like elasticity.

The following examples illustrate the present invention without, however, limiting the same thereto. In the following examples, parts are by weight.

EXAMPLE 1

A photosensitive resin composition had the following ingredients:
Syndiotactic 1,2-polybutadiene "JSR RB 810" (trade name of Japan Synthetic Rubber Co., Ltd.; 1,2-unit content, 90%; crystallinity, 15%): 100 parts
Neopentylglycol dimethacrylate: 30 parts
Lauryl methacrylate: 10 parts
Benzoin isopropyl ether: 3 parts The latter four ingredients were mixed with each other to form a solution which was in turn mixed with the syndiotactic 1,2-polybutadiene pellets for about 1 hour at 40° C. by means of a mixer, thereby making the solution contained uniformly therein. The pellets were then molded into sheets having a thickness of 2 millimeters onto a polyester sheet with a 2 mm. spacer, previously subjected with both sides to the sanding treatment, by a press at a temperature of 110° C. and 10 kilograms per square cantimeter over a period of about 50 seconds. After the sheet was cooled, the polyester sheet was removed from the surface of the sheet. The molded sheet was then brought into intimate contact with a negative film by means of a vacuum printer and irradiated with a 3 kilowatt high-pressure mercury lamp for 5 minutes from the distance of 80 centimeter. After the exposure was completed, the negative was removed and xylene was sprayed at a pressure of 2 kilograms per square centimeter for 4 minutes against the exposed surface of the sheet, whereby a pattern in relief having a dapth of about 700 microns was produced. The sheet was dried by means of a dryer and subjected again to exposure to the mercury lamp for 3 minutes. The resulting printing plate could reproduce a very clear pattern of the negative. It was also found that the plate had a sufficient hardness of 90 degrees as measured by a "Shore A Durometer."

EXAMPLE 2

A photosensitive resin composition had the following ingredients:
Syndiotactic 1,2-polybutadiene "JSR RB 810": 100 parts
Lauryl methacrylate: 18 parts
Trimethylolpropane trimethacrylate: 4 parts
Benzoin isopropyl ether: 3 parts These ingredients were treated in the same manner as in Example 1 to give a printing plate with a sufficient rubber elasticity having a hardness of about 75 degrees.

EXAMPLE 3

A resin composition had the following ingredients:
Syndiotactic 1,2-polybutadiene "JSR RB 820" (Japan Synthetic Rubber Co., Ltd.; 1,2-unit, 92%; crystallinity, 25%): 100 parts
2-Ethylhexyl methacrylate: 60 parts
Benzoin isopropyl ether: 2 parts These ingredients were treated in the same manner as in Example 1 to give a printing plate. This plate was found to have a hardness of 85 degrees with a sufficient rubber elasticity.

EXAMPLE 4

A resin composition had the following ingredients:

Syndiotactic 1,2-polybutadiene "JSR RB 810": 100 parts
Neopentyl glycol acrylate: 10 parts
Diisodecyl phthalate: 30 parts
Benzoin isopropyl ether: 3 parts
p-Methoxyphenol: 0.05 parts These ingredients were treated in the same manner as in Example 1 to give a printing plate. The plate was found to have a hardness of 65 degrees with a sufficient rubber elasticity.

EXAMPLE 5

A resin composition had the following ingredients:
Syndiotactic 1,2-polybutadiene "JSR RB 810": 100 parts
Neopentyl glycol dimethacrylate: 10 parts
Stearyl vinyl ether: 30 parts
Benzoin isopropyl ether: 3 parts
p-Methoxyphenol: 0.05 parts These ingredients were treated in the same manner as in Example 1. The resulting printing plate was found to have a hardness of 60 degrees with a sufficient rubber elasticity.

EXAMPLE 6

A resin composition having the following ingredients was prepared:
Syndiotactic 1,2-polybutadiene "JSR RB 810": 100 parts
Polyisoprene rubber "JSR IR 2200", (trade mark of Japan Synthetic Rubber Co., Ltd.): 30 parts
Neopentyl glycol dimethacrylate: 10 parts
Lauryl methacrylate: 30 parts
Benzoin isopropyl ether: 3 parts
p-Methoxyphenol: 0.05 parts A mixture of syndiotactic 1,2-polybutadiene and polyisoprene rubber was roll-milled with a rolling mill having a surface temperature of 140° C. and cut into pastes. The pastes were then mixed with the other ingredients by means of a mixer and the mixture was treated in the same manner as in Example. This gave a printing plate having a rubber hardness of 50 degrees and a good rubber elasticity.

REFERENCE EXAMPLE

A mixture of 100 parts of syndiotactic 1,2-polybutadiene "JSR RB 810" and 3 parts of benzoin isopropyl ether was roll-milled with a rolling mill having a surface temperature of 140° C. and then treated in the same manner as in Example 1 by means of a press, thereby giving a resin master plate.

This resin master plate was compared with resin master plates prepared from the compositions of Examples 1 to 6 with respect to its properties as the printing plate.

The performance test was carried out as follows: Each of the resin master plate was exposed through an identical test chart negative to ultraviolet radiations for 5 minutes (Examples 1 to 6) and for 10 minutes (Reference Example), and the uncured areas were removed by spraying xylene at a spraying pressure of 2 kilograms per square centimeter against the exposed surface of the plate for 4 minutes. The plate was then dried and exposed again with ultraviolet irradiation. The plate thus treated was determined with respect to its relief depth, minimum line width, half tone dot, and resolving power.

Of the performance tests, the half tone dot test is conducted to determine whether the dots having a diameter of about 90 microns of the lines drawn by 65 lines per inch are remained or not after the xylene treatment. In the table which follows, "Good" means that all the dots remain as are present on the test chart negative used, ad "Poor" means no or little remaining of such dots.

TABLE

| Resin Composition | Relief depth | Minimum line width | Half tone dot | Resolving* power |
| --- | --- | --- | --- | --- |
| Example 1 | 0.7 mm. | 100 microns | Good | 150 |
| Example 2 | 0.7 mm. | 100 microns | Good | 85 |
| Example 3 | 0.7 mm. | 110 microns | Good | 85 |
| Example 4 | 0.8 mm. | 150 microns | Good | 133 |
| Example 5 | 0.8 mm. | 150 microns | Good | 133 |
| Example 6 | 0.7 mm. | 150 microns | Good | 133 |
| Reference Example | 0.6 mm. | 300 microns | Poor | 65** |

Note:
*The value of the resolving power is expressed in lines per inch.
**This value referred to above is intended to mean that even the lines drawn by 65 lines per inch were not resolved with the cured areas dissolved in part and rendered rough.

The table indicates that the photosensitive resin composition of the present invention present excellent overall performances.

What I claim is:

1. A molded sheet suitable for use as a flexographic printing plate which is melt-molded from a photosensitive resin composition comprising syndiotactic 1,2-polybutadiene permeated with a solution of an ethylenically unsaturated monomer and a photo-polymerization initiator, the syndiotactic 1,2-polybutadiene having an average molecular weight of from about 10,000 to 300,000, a 1,2-unit content of at least about 80 percent and a crystallinity of about 10 to 30 percent, the ethylenically unsaturated monomer being an ester of acrylic or methacrylic acid with an alkanol having from 4 to 20 carbon atoms, and the photo-polymerization initiator being benzoin or an alkyl ether thereof.

2. A process for making a molded sheet suitable for use as a flexographic printing plate comprising:
   (a) immersing syndiotactic 1,2-polybutadiene pellets in a solution of an ethylenically unsaturated monomer and a photo-polymerization initiator so that the solution permeates the pellets, the syndiotactic 1,2-polybutadiene having an average molecular weight of from about 10,000 to 300,000, a 1,2-unit content of at least about 80 percent and a crystallinity of about 10 to 30 percent, the ethylenically unsaturated monomer being an ester of acrylic or methacrylic acid with an alkanol having from 4 to 20 carbon atoms, and the photopolymerication initiator being benzoin or an alkyl ether thereof; and then
   (b) melt molding said pellets into sheets having a thickness in the range of about 0.1 to 10 mm.

3. The process of claim 2 wherein said melt molding is carried out at a temperature of about 90°–160° C.

* * * * *